US008487789B2

(12) United States Patent
Choo et al.

(10) Patent No.: US 8,487,789 B2
(45) Date of Patent: Jul. 16, 2013

(54) METHOD AND APPARATUS FOR LOSSLESS ENCODING AND DECODING BASED ON CONTEXT

(75) Inventors: Ki Hyun Choo, Seoul (KR); Eun Mi Oh, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 78 days.

(21) Appl. No.: 13/137,025

(22) Filed: Jul. 15, 2011

(65) Prior Publication Data

US 2012/0020406 A1 Jan. 26, 2012

(30) Foreign Application Priority Data

Jul. 21, 2010 (KR) ........................ 10-2010-0070611

(51) Int. Cl.
*H03M 7/00* (2006.01)

(52) U.S. Cl.
USPC .................. 341/50; 341/51; 341/200; 341/67

(58) Field of Classification Search
USPC ...................... 341/50, 51, 67, 200; 704/200.1
See application file for complete search history.

(56) References Cited

U.S. PATENT DOCUMENTS 5,798,719 A * 8/1998 Wise et al. ...................... 341/67
6,664,913 B1 * 12/2003 Craven et al. ................. 341/200
7,272,567 B2 * 9/2007 Fejzo ............................ 704/500
7,623,047 B2 * 11/2009 Ordentlich et al. ............. 341/51
8,013,866 B2 * 9/2011 Yoshida et al. ............... 345/589
2004/0208169 A1 * 10/2004 Reznik .......................... 370/352
2005/0192799 A1 * 9/2005 Kim et al. ..................... 704/229
2007/0078646 A1 * 4/2007 Lei et al. .................... 704/200.1
2007/0127580 A1 6/2007 Lei et al.
2008/0094259 A1 * 4/2008 Yu et al. .......................... 341/51
2010/0052956 A1 3/2010 Choo et al.

FOREIGN PATENT DOCUMENTS

KR 10-0561869 3/2006
KR 10-2007-0002065 1/2007
KR 10-2007-0040392 4/2007
KR 10-2010-0008312 1/2010
KR 10-2010-0025710 3/2010
KR 10-2010-0035955 4/2010

OTHER PUBLICATIONS

International Search Report mailed Feb. 22, 2012 in corresponding International Patent Application PCT/KR2011/005367.

* cited by examiner

*Primary Examiner* — Jean B Jeanglaude
(74) *Attorney, Agent, or Firm* — Staas & Halsey LLP

(57) ABSTRACT

Provided are a method and apparatus of a lossless encoding and decoding based on a context. According to an embodiment, by aligning and coding symbols of a MSB, a coding efficiency may be enhanced. According to an embodiment, by estimating initial scaling information using a symbol located proximate to a symbol of the MSB, the coding efficiency may be enhanced.

21 Claims, 11 Drawing Sheets

| y \ x | 0 | 1 | 2 | 3 | 4 |
|---|---|---|---|---|---|
| 0 | (0,0) | (1,0) | (2,0) | (3,0) | (4,0) |
| 1 | (0,1) | (1,1) | (2,1) | (3,1) | (4,1) |
| 2 | (0,2) | (1,2) | (2,2) | (3,2) | (4,2) |
| 3 | (0,3) | (1,3) | (2,3) | (3,3) | (4,3) |
| 4 | (0,4) | (1,4) | (2,4) | (3,4) | (4,4) |

METHOD AND APPARATUS FOR LOSSLESS ENCODING AND DECODING BASED ON CONTEXT

CROSS-REFERENCE TO RELATED APPLICATIONS

This application claims the benefit under 35 U.S.C. §119 (a) of Korean Patent Application No. 10-2010-0070611, filed on Jul. 21, 2010, in the Korean Intellectual Property Office, the entire disclosure of which is incorporated herein by reference for all purposes.

BACKGROUND

1. Field

The following description relates to a method and apparatus of encoding and decoding a quantized frequency spectrum coefficient based on a context.

2. Description of the Related Art

An audio signal is generally encoded and decoded in a frequency domain. Advance audio coding (AAC) may be used as a representative example. An AAC codec may be used as an example. The AAC codec may perform a modified discrete cosine transform (MDCT) for converting a time domain into the frequency domain, and may perform a frequency spectrum quantization using a masking degree of a signal from a psychoacoustic viewpoint. To further compress a performed quantization result, a lossless compression scheme may be applied. The ACC may use a Huffman coding scheme as the lossless compression scheme. A bit-sliced arithmetic coding (BSAC) codec to which an arithmetic coding scheme is applied instead of the Huffman coding scheme as the lossless compression scheme may be used.

When an object of lossless encoding is further examined, a quantized value of a quantized spectrum coefficient may be considered as a symbol, and the lossless encoding may be performed with respect to the symbol. An encoding may be performed by mapping a value of the quantized spectrum coefficient on a bitplane to pack bits. In the case of performing lossless encoding based on a context, the lossless encoding may be performed based on information of a previous frame. Accordingly, there is a desire for effectively performing the lossless encoding.

SUMMARY

In one general aspect, there is provided an encoding apparatus to configure a quantized frequency spectrum coefficient as at least one tuple, and to separate the at least one tuple into a most significant bit (MSB) and a least significant bit (LSB) to encode the MSB and the LSB. The encoding apparatus includes a processor to control one or more processor-executable units, a rearrangement unit to rearrange symbols of the MSB, and a sequence information encoder to encode sequence information between the symbols of the MSB.

In another general aspect, there is provided a decoding apparatus to configure a quantized frequency spectrum coefficient as at least one tuple, and to separate the at least one tuple into an MSB and an LSB to decode the MSB and the LSB. The decoding apparatus includes a processor to control one or more processor-executable units, an MSB decoder to decode symbols of an encoded MSB, a sequence information decoder to decode sequence information between the symbols based on the symbols of the decoded MSB, and an alignment unit to align the symbols of the MSB based on the sequence information.

In still another general aspect, there is provided an encoding apparatus to configure a quantized frequency spectrum coefficient as at least one tuple, and to separate the at least one tuple into an MSB and an LSB to encode the MSB and the LSB. The encoding apparatus includes a processor to control one or more processor-executable units, and a scaling information estimating unit to estimate initial scaling information associated with symbols of the MSB.

In a further general aspect, there is provided a decoding apparatus to configure a quantized frequency spectrum coefficient as at least one tuple, and to separate the at least one tuple into an MSB and an LSB to decode the MSB and the LSB. The decoding apparatus includes a processor to control one or more processor-executable units, and a scaling information estimating unit to estimate initial scaling information associated with symbols of the MSB.

In still another general aspect, there is provided an encoding method of configuring a quantized frequency spectrum coefficient as at least one tuple, and separating the at least one tuple into an MSB and an LSB to encode the MSB and the LSB. The encoding method includes rearranging symbols of the MSB in an ascending order of value, and encoding, by way of a processor, sequence information between the symbols of the MSB when values of the symbols are different from each other.

In yet another general aspect, there is provided a decoding method of configuring a quantized frequency spectrum coefficient as at least one tuple, and separating the at least one tuple into an MSB and an LSB to decode the MSB and the LSB. The decoding method includes decoding symbols of an encoded MSB, decoding, by way of a processor, sequence information between the symbols based on the symbols of the decoded MSB, and aligning the symbols of the MSB based on the sequence information.

In still yet another general aspect, there is provided an encoding method of configuring a quantized frequency spectrum coefficient as at least one tuple, and separating the at least one tuple into an MSB and an LSB to encode the MSB and the LSB. The encoding method includes estimating, by way of a processor, initial scaling information associated with symbols of the MSB.

In still another general aspect, there is provided a decoding method of configuring a quantized frequency spectrum coefficient as at least one tuple, and separating the at least one tuple into an MSB and an LSB to decode the MSB and the LSB. The decoding method includes estimating, by way of a processor, initial scaling information associated with symbols of the MSB.

According to an embodiment, by rearranging a sequence of symbols of a MSB and coding sequence information, a number of the symbols of the MSB to be coded may be decreased to enhance a coding efficiency.

According to an embodiment, by estimating initial scaling information, a number of bits consumed for encoding an escape code may be decreased to enhance a coding efficiency.

Other features and aspects will be apparent from the following detailed description, the drawings, and the claims.

Figure 1:
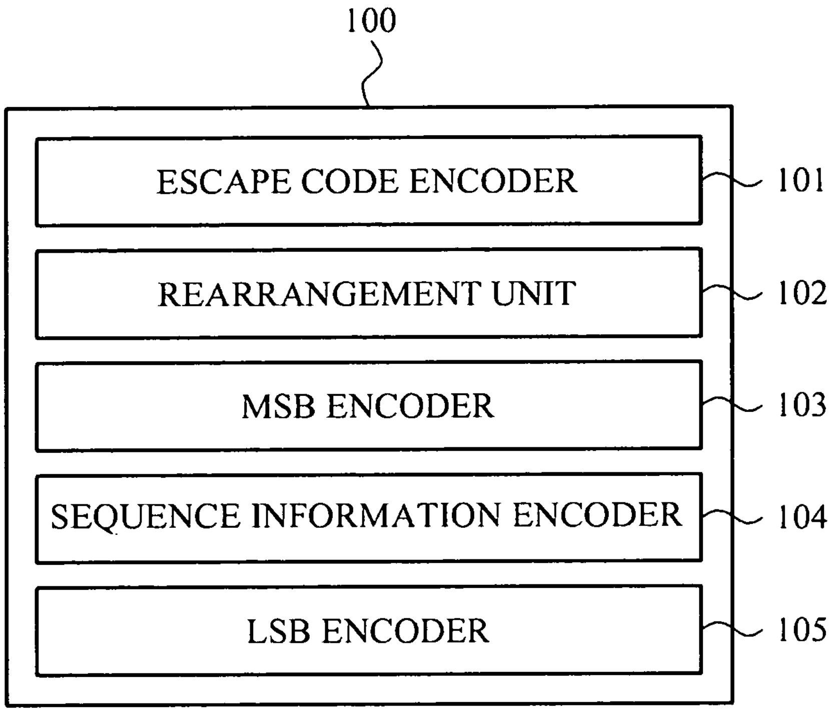
FIG. 1 is a diagram illustrating an example of a configuration of an encoding apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

FIG. 1 includes an example of an encoding apparatus 100.

Referring to FIG. 1, the encoding apparatus 100 may include, for example, an escape code encoder 101, a rearrangement unit 102, a most significant bit (MSB) encoder 103, a sequence information encoder 104, and a least significant bit (LSB) encoder 105. The encoding apparatus 100 may configure a quantized frequency spectrum coefficient as at least one tuple, and may separate the at least one tuple into the MSB and the LSB to encode the MSB and the LSB.

The escape code encoder 101 may encode an escape code. When a value of the quantized frequency spectrum coefficient deviates from a predetermined range, the encoding apparatus 100 may scale the quantized frequency spectrum coefficient so that the value of the quantized frequency spectrum coefficient may be included in the predetermined range in consideration of a memory limit. Here, the escape code may correspond to information indicating whether the scaling is performed with respect to the quantized frequency spectrum coefficient.

The escape code may include a probability model with a similar level as the symbols of the MSB. The escape code may be encoded at the same time as the MSB is encoded, or may be encoded separately. The escape code encoder 101 may encode the escape code based on a number of times the scaling is performed. When the scaling is no longer performed, symbols of the MSB may be configured in the quantized frequency spectrum coefficient to encode the symbols of the MSB.

The rearrangement unit 102 may rearrange the symbols of the MSB. In particular, the rearrangement unit 102 may rearrange the symbols of the MSB in an ascending order. Since the symbols of the MSB desired to be encoded may decrease, a coding efficiency may be enhanced. An operation of the rearrangement unit 102 will be described with reference to FIG. 8.

The MSB encoder 103 may perform an arithmetic encoding with respect to the rearranged symbols of the MSB. For example, the MSB encoder 103 may perform a context based encoding with respect to a current symbol using, as a context, a proximately located symbol corresponding to a previous frequency domain of a previous frame or current frame, based on the current symbol of the MSB desired to be encoded. The MSB encoder 103 may select one of a plurality of probability models corresponding to the context to encode the symbols of the MSB. The MSB encoder 103 will be further described with reference to FIG. 5 through FIG. 7.

The sequence information encoder 104 may encode sequence information between the symbols of the MSB. For example, when values of the symbols of the MSB are different from each other, the sequence information encoder 104 may encode sequence information between the symbols. When the values of the symbols of the MSB are arranged in an ascending order, the sequence information may be set to "0," for example. When the values of the symbols of the MSB are arranged in a descending order, the sequence information may be set to be "1," for example. When the values of the symbols of the MSB are the same, the sequence information between the symbols need not be encoded. The sequence information may be encoded the same way the symbols of the MSB are encoded.

A residual bit may be generated after performing the scaling through the escape code. The LSB encoder 105 may encode symbols of the LSB corresponding to the residual bit.

Figure 2:
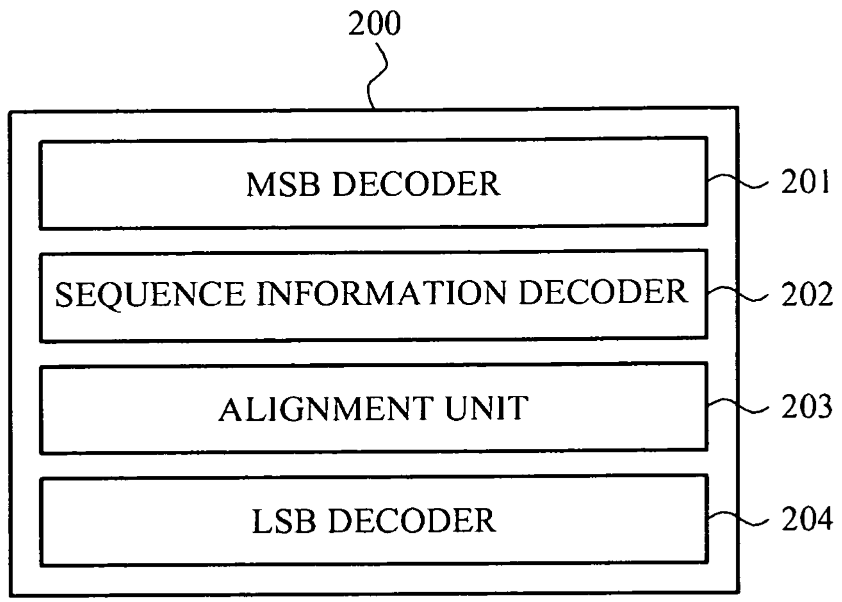
FIG. 2 is a diagram illustrating an example of a configuration of a decoding apparatus.

FIG. 2 includes an example of a configuration of a decoding apparatus 200.

FIG. 2 illustrates the decoding apparatus 200 corresponding to the encoding apparatus 100 of FIG. 1. The decoding apparatus 200 may configure a quantized frequency spectrum coefficient as at least one tuple, and may separate the at least one tuple into an MSB and a LSB to decode the MSB and the LSB. Referring to FIG. 2, the decoding apparatus 200 may include, for example, an MSB decoder 201, a sequence information decoder 202, an alignment unit 203, and an LSB decoder 204.

The MSB decoder 201 may perform a decoding determining whether a symbol corresponds to an escape code or a symbol of the MSB through an arithmetic decoding.

When the escape code and the symbol of the MSB include a symbol of the same level, the MSB decoder 201 may perform a context based decoding with respect to a current symbol using, as a context, a proximately located symbol corresponding to a previous frequency domain of a previous frame or current frame, based on the current symbol of the MSB desired to be decoded.

In contrast, when the escape code and the symbol of the MSB include a symbol of different levels, the decoding apparatus 200 may decode the escape code, and may scale the symbol of the MSB the same number of times as a number of times in which the decoding of the escape code is performed. The MSB decoder 201 may decode the scaled symbol of the MSB.

The sequence information decoder 202 may decode the sequence information between symbols based on symbols of the MSB. In this instance, the sequence information decoder 202 may decode the sequence information between symbols when the symbols of the MSB are different from each other. In contrast, when the symbols of the MSB are the same, the operation of decoding the sequence information between symbols may be omitted.

For example, the sequence information decoder 202 may decode in the same scheme as decoding the symbols of the MSB. The sequence information decoder 202 may configure a context based on a proximately located quantized spectrum coefficient, and may select one of a plurality of probability models based on the context to decode the sequence information.

The alignment unit 203 may align the symbols of the MSB based on the decoded sequence information. When the symbols of the MSB are scaled the same number of times as a number of times in which the decoding of the escape code has been performed, the LSB decoder 204 may decode a symbol of the LSB, and then add the decoded symbol of the LSB to the scaled symbols of the MSB. A final frequency spectrum coefficient may be restored.

Figure 3:
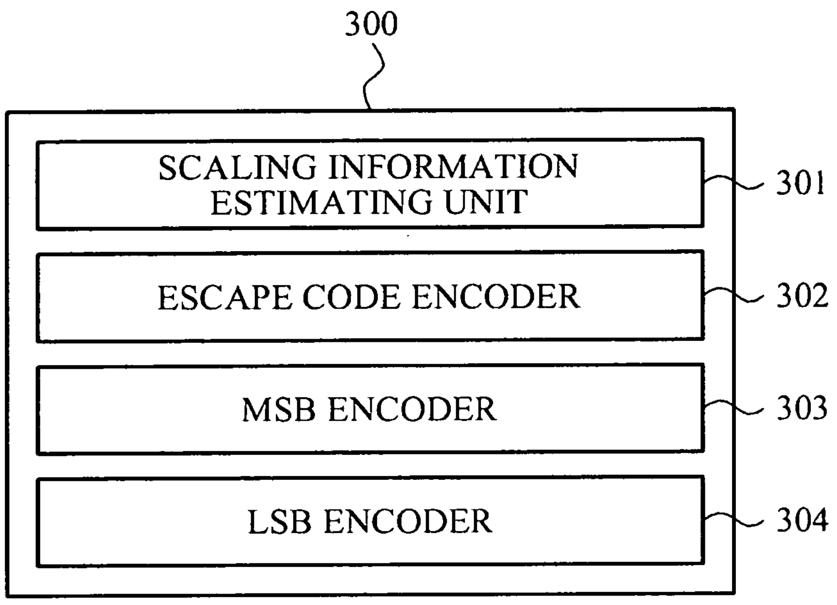
FIG. 3 is a diagram illustrating another example of a configuration of an encoding apparatus.

FIG. 3 includes another example of an encoding apparatus 300.

Referring to FIG. 3, the encoding apparatus 300 may include, for example, a scaling information estimating unit 301, an escape code encoder 302, an MSB encoder 303, and an LSB encoder 304. In this instance, the encoding apparatus 300 may configure a quantized frequency spectrum coefficient as at least one tuple, and may separate the at least one tuple into an MSB and a LSB to encode the MSB and the LSB.

The scaling information estimating unit 301 may estimate initial scaling information associated with a symbol of the MSB.

For example, the scaling information estimating unit 301 may estimate the initial scaling information based on a context mode. The context mode corresponds to relative location information of a symbol located proximate to a symbol of the MSB based on the symbol of the MSB desired to be currently encoded. In this instance, the proximately located symbol may correspond to a symbol corresponding to a previous frequency domain of a previous frame or a current frame based on the current frame corresponding to the symbol of the MSB desired to be currently encoded.

The context mode may indicate the relative location information between the proximately located symbol to be used for estimating the initial scaling information and the symbol desired to be currently encoded. The context mode may be transmitted once for each frame. The context mode may be allocated to each of a low-frequency domain and a high-frequency domain, and may be transmitted one at a time by packing the allocated context mode.

For example, the scaling information estimating unit 301 may estimate the initial scaling information based on a size of the proximately located symbol determined through the context mode. In particular, the scaling information estimating unit 301 may determine a spectrum coefficient to estimate the initial scaling information based on the context mode, and may estimate the initial scaling information based on the determined spectrum coefficient. For example, when a vector includes a single frequency spectrum coefficient, two context modes may be used. When the context mode corresponds to "0", the scaling information estimating unit 301 may use the quantized frequency spectrum coefficient corresponding to the same frequency domain of the previous frame. When the context mode corresponds to "1", the scaling information estimating unit 301 may use the quantized frequency spectrum coefficient corresponding to the previous frequency domain of the current frame.

For example, the scaling information estimating unit 301 may estimate the initial scaling information based on a pseudo-code shown below.

```
lev_ctx=0;
  if(ctx>7)
    {
        do {
              ctx>>=2;
              lev_ctx++;
        } while(ctx>7);
    }
  if (lev_ctx>=2)
lev=1;
```

Here, "ctx" may indicate a value of the quantized frequency spectrum coefficient determined based on the context mode, and "lev_ctx" may correspond to information indicating a number of times scaling is performed to change "ctx" to the symbol of the MSB. In this instance, when a value of "lev_ctx" is greater than or equal to "2", the initial scaling information may be estimated to be "1".

According to an embodiment, by estimating the initial scaling information, a bit number consumed for encoding an escape code may be decreased to enhance a coding efficiency.

The escape code encoder 302 may determine whether the quantized frequency spectrum coefficient scaled based on the initial scaling information deviates from a predetermined range for the symbol of the MSB to encode the escape code. The frequency spectrum coefficient may be scaled the same number of times as the number of times in which encoding of the escape code is performed.

When the scaling is no longer performed, the MSB encoder 303 may encode the scaled symbol of the MSB. An operation of the LSB encoder 304 may be the same as the LSB encoder 105 described with reference to FIG. 1.

The LSB corresponding to a residual bit generated in a scaling process may be encoded through the LSB encoder 304. An operation of the LSB encoder 304 may be the same as the LSB encoder 105 described with reference to FIG. 1.

Figure 4:
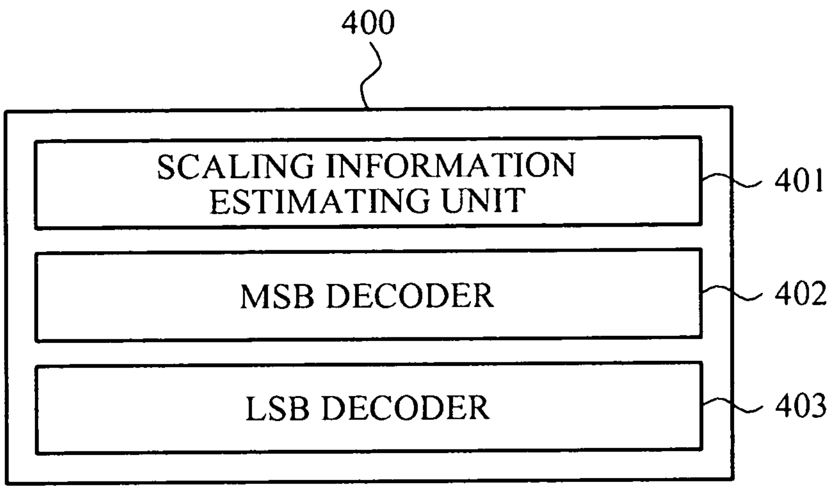
FIG. 4 is a diagram illustrating another example of a configuration of a decoding apparatus.

FIG. 4 includes another example of a decoding apparatus 400.

Referring to FIG. 4, the decoding apparatus 400 may include, for example, a scaling information estimating unit 401, an MSB decoder 402, and an LSB decoder 403. The decoding apparatus 400 of FIG. 4 may configure a quantized frequency spectrum coefficient as at least one tuple, and may separate the at least one tuple into a MSB and a LSB to decode the MSB and the LSB.

The scaling information estimating unit 401 may estimate initial scaling information associated with a symbol of the MSB. An operation of the scaling information estimating unit 401 may be the same as the scaling information estimating unit 301 of FIG. 3. The estimated initial scaling information may be used for scaling the symbol of the MSB.

For example, when the initial scaling information is estimated to be "1", the symbol of the decoded MSB may be scaled as "1". The initial scaling information may correspond to a value determined by an agreement between the encoding apparatus 300 of FIG. 3 and the decoding apparatus 400.

The MSB decoder 402 may decode the symbol of the MSB. An operation of the MSB decoder 402 may be the same as the MSB decoder 201 of FIG. 2. The decoded symbol of the MSB may be scaled the same number of times as the number of times in which the decoding of an escape code is performed.

The LSB decoder 403 may decode the symbol of the LSB. An operation of the LSB decoder 403 may be the same as the LSB decoder 204 of FIG. 2. The symbol of the LSB may be added to the scaled symbol of the MSB to restore the finally decoded frequency spectrum coefficient.

Figure 5:
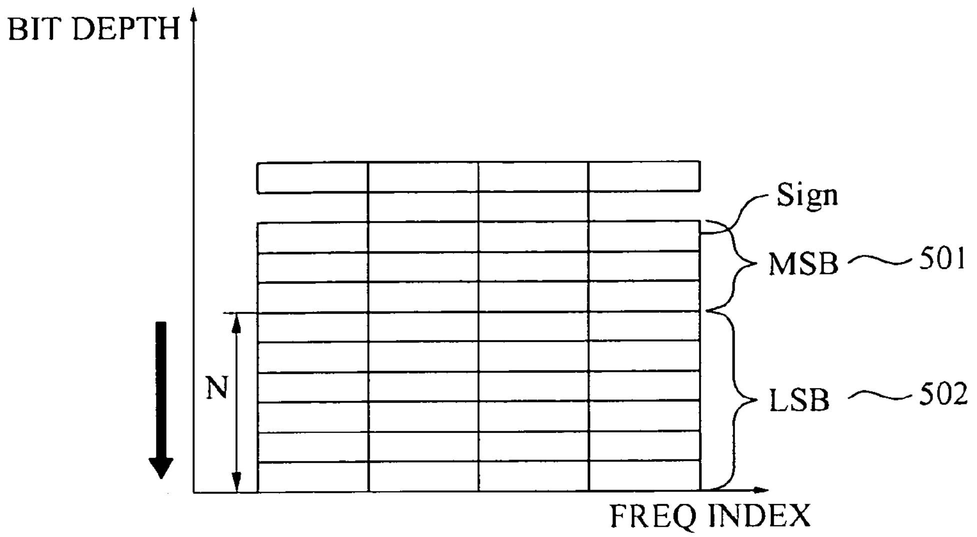
FIG. 5 is a diagram illustrating an example of a vector including a frequency spectrum coefficient.

FIG. 5 includes an example of a vector including a frequency spectrum coefficient.

Referring to FIG. 5, an MSB and an LSB are illustrated based on a frequency index and bit-depth. In this instance, the MSB may indicate a bit including sign information.

Referring to FIG. 5, the MSB and the LSB may configure a vector by grouping a quantized frequency spectrum coefficient into at least one unit according to a frequency index. Each unit may configure a symbol, and the MSB and the LSB may be coded in a symbol unit. In FIG. 5, "N" corresponding to a depth of the LSB may indicate a level, and may be controlled based on a number of times scaling of the MSB is performed.

Figure 6:
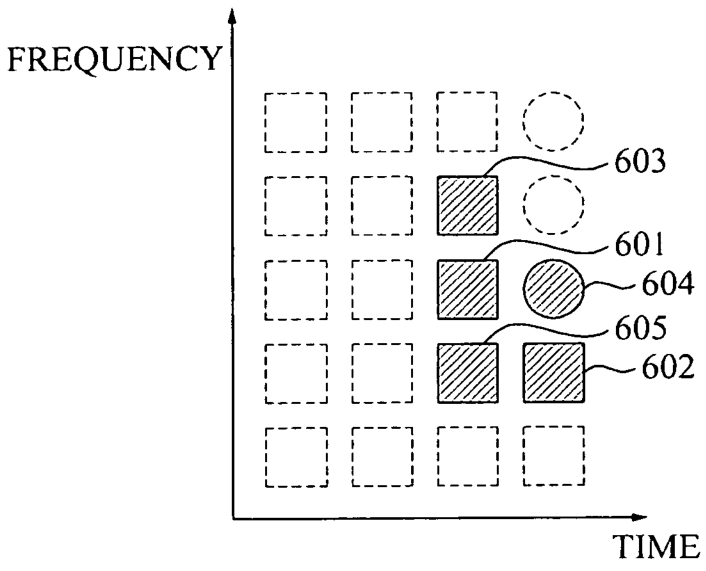
FIG. 6 is a diagram illustrating an example of a proximately located symbol associated with a context mode.

FIG. 6 includes an example of a proximately located symbol associated with a context mode.

According to an embodiment, proximately located symbols 601, 602, 603, and 605 located proximate to a symbol 604 of a MSB may be used for encoding the symbol 604 of the MSB. In this instance, the proximately located symbols 601, 603, and 605 may correspond to symbols corresponding to a previous frame of the symbol 604 of the MSB, and may indicate previously encoded symbols. The proximately located symbol 602 may correspond to a symbol corresponding to a previous frequency domain of a current frame of the symbol 604 of the MSB, and may indicate a previously encoded symbol.

The proximately located symbols 601, 602, 603, and 605 may configure a context to be used for encoding the symbol 604 of the MSB. In particular, the proximately located symbols 601, 602, 603, and 605 may be set as a context mode according to a relative location. A symbol to be used for initial scaling information may be determined based on the proximately located symbols corresponding to the context mode.

Figure 7:
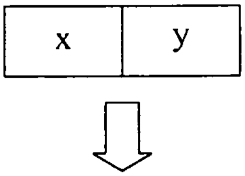
FIG. 7 is a diagram illustrating an example of a process of rearranging symbols of a most significant bit (MSB).

FIG. 7 includes an example of a process of rearranging symbols of a MSB.

Referring to FIG. 7, a quantized frequency spectrum coefficient may include two symbols. That is, a vector may include two symbols of the quantized frequency spectrum coefficient. A number of symbols may not be limited to two, and two or more symbols may be similarly applied.

It may be assumed that a first symbol is set to be x, a second symbol is set to be y, and absolute values of x and y are less than or equal to 4. Thus, 26 (i.e., 5*5+1) types of vectors including an escape code may be expressed. The rearrangement unit 102 of FIG. 1, according to an embodiment, may rearrange the symbols of the MSB. In particular, the rearrangement unit 102 may rearrange the symbols of the MSB in an ascending order of value.

Referring to FIG. 7, when the symbols of the MSB correspond to (3, 1), that is, the symbols of the MSB are arranged in a descending order, the rearrangement unit 102 may rearrange the symbols of the MSB to be (1, 3). When the symbols of the MSB are arranged in ascending order, or values of the symbols are the same, the rearrangement unit 102 may not rearrange the symbols of the MSB.

In this case, sequence information may be set to "0," in a case where the symbols of the MSB are arranged in the ascending order, and the sequence information may be set to "1," in a case where the symbols of the MSB are arranged in the descending order. The sequence information may be encoded as the symbols of the MSB. The symbols of the MSB to be encoded in a rearrangement process may include (0, 0), (0, 1), (0, 2), (0, 3), (0, 4), (1, 1), (1, 2), (1, 3), (1, 4), (2, 2), (2, 3), (2, 4), (3, 3), (3, 4), (4, 4). Even though all of the symbols of the 25 types of MSBs are not encoded, the same result may be derived by encoding the sequence information and the symbols of the 15 listed types of MSB. By changing a configuration scheme of the symbols of the MSB, a memory for storing a coded result may be reduced.

Figure 8:
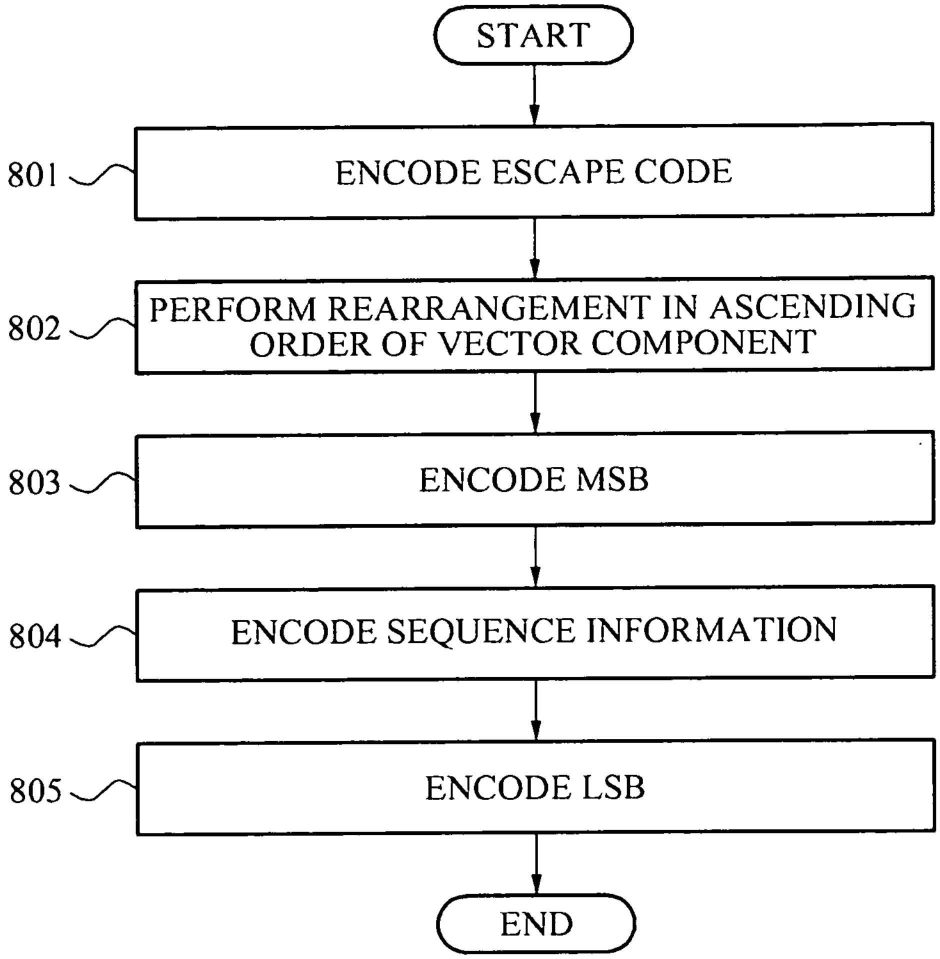
FIG. 8 is a flowchart illustrating an example of a configuration of an encoding method.

FIG. 8 includes an example of an encoding method.

A quantized frequency spectrum coefficient may be separated into an MSB and an LSB to encode the MSB and the LSB, for example by encoding apparatus 100 of FIG. 1, according to an embodiment.

In operation 801, an escape code may be encoded, for example by encoding apparatus 100. When a value of the quantized frequency spectrum coefficient deviates from a predetermined range, the encoding apparatus 100 may scale the quantized frequency spectrum coefficient so that the value of the quantized frequency spectrum coefficient may be included in the predetermined range in consideration of a memory limit. In this instance, the escape code may correspond to information indicating whether the scaling is performed with respect to the quantized frequency spectrum coefficient. In particular, a target to be scaled may correspond to the MSB in the quantized frequency spectrum coefficient.

In operation 802, symbols of the MSB may be rearranged, for example, by the encoding apparatus 100. In particular, the encoding apparatus 100 may rearrange the symbols of the MSB in an ascending order of values of the symbols. Since the symbols of the MSB to be encoded are reduced, a coding efficiency may be enhanced.

In operation 803, an arithmetic encoding may be performed with respect to the rearranged symbols of the MSB, for example, by the encoding apparatus 100. For example, the encoding apparatus 100 may perform a context based encoding with respect to a current symbol using, as a context, a proximately located symbol corresponding to a previous frequency domain of a previous frame or current frame, based on the current symbol desired to be encoded. The encoding apparatus 100 may select one of a plurality of probability models corresponding to the context to encode the symbols of the MSB.

In operation 804, sequence information may be encoded between the symbols of the MSB, for example, by the encoding apparatus 100. For example, when values of the symbols of the MSB are different from each other, the encoding apparatus 100 may encode sequence information between the symbols. When the values of the symbols of the MSB are the same, the sequence information between the symbols need not be encoded. The sequence information may be encoded in the same way as the encoding the symbols of the MSB.

A residual bit may be generated after performing the scaling through the escape code. In operation 805, symbols of the LSB corresponding to the residual bit may be encoded, for example, by the encoding apparatus 100.

Figure 9:
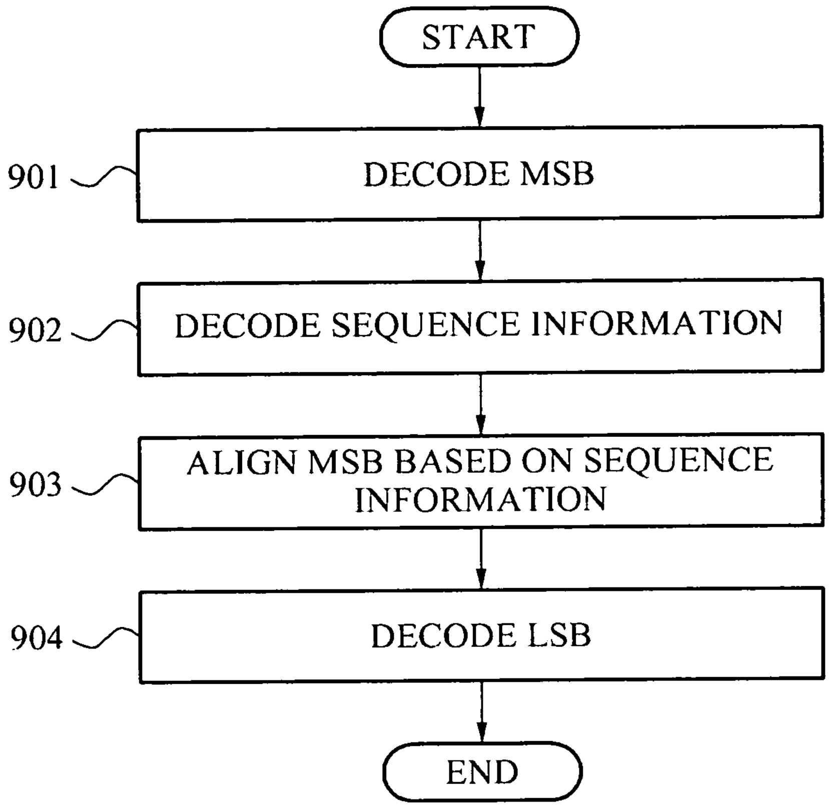
FIG. 9 is a flowchart illustrating an example of a configuration of a decoding method.

FIG. 9 includes an example of a decoding method.

In operation 901, a decoding determining whether a symbol corresponds to an escape code or a symbol of a MSB may be performed through an arithmetic decoding, for example, by decoding apparatus 200 of FIG. 2.

When the escape code and the symbol of the MSB include a symbol of the same level, the decoding apparatus 200 may perform a context based decoding with respect to a current symbol using, as a context, a proximately located symbol corresponding to a previous frequency domain of a previous frame or current frame, based on the current symbol desired to be decoded.

In contrast, when the escape code and the symbol of the MSB include a symbol of different level, the escape code, may be decoded, for example, by decoding apparatus 200, and may scale the symbol of the MSB the same number of times as a number of times in which the decoding of the escape code is performed. The decoding apparatus 200 may decode the scaled symbol of the MSB.

In operation 902, the sequence information may be decoded between symbols based on the symbols of the MSB, for example, by decoding apparatus 200. In this instance, the decoding apparatus 200 may decode the sequence information between symbols when the symbols of the MSB are different from each other.

In operation 903, the symbols of the MSB may be aligned based on the decoded sequence information, for example, by decoding apparatus 200. When the symbols of the MSB are scaled the same number of times as the number of times in which decoding of the escape code is performed, the decoding apparatus 200 may decode a symbol of the LSB in operation 904, and then add the decoded symbol of the LSB to the scaled symbols of the MSB. Accordingly, a final frequency spectrum coefficient may be restored.

Figure 10:
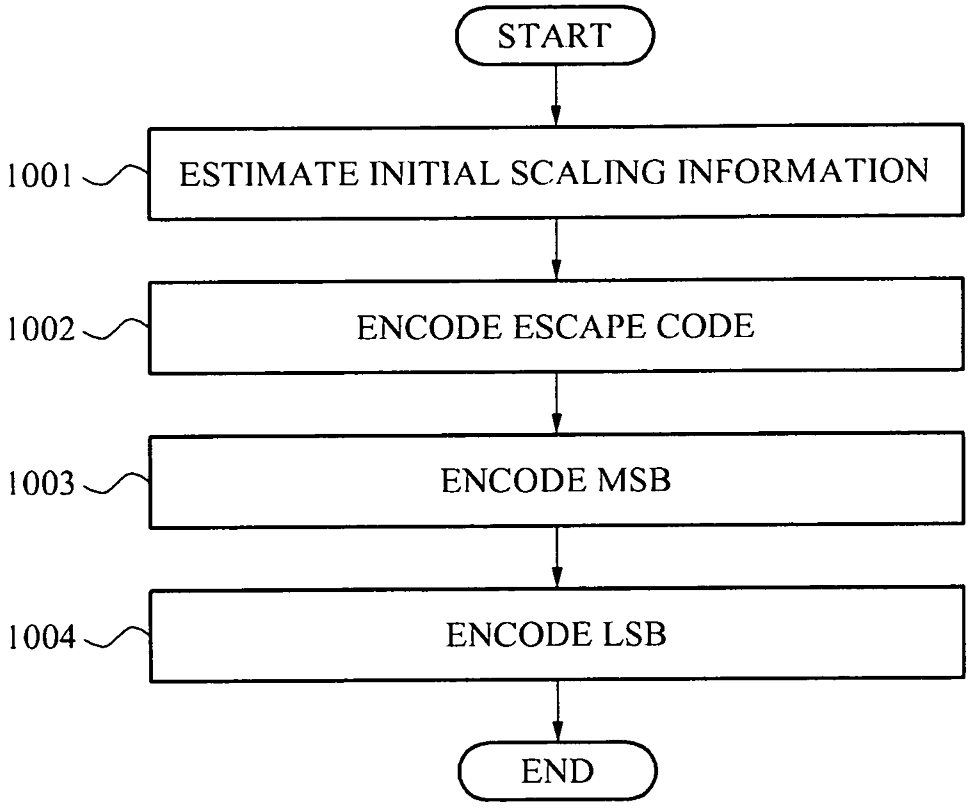
FIG. 10 is a flowchart illustrating another example of a configuration of an encoding method.

FIG. 10 includes another example of an encoding method.

In operation 1001, initial scaling information associated with a symbol of the MSB may be estimated, for example, by the encoding apparatus 300 of FIG. 3.

For example, the initial scaling information may be estimated, for example, by the encoding apparatus 300 of FIG. 3, based on a context mode corresponding to relative location information of a symbol located proximate to a symbol of the MSB based on the symbol of the MSB desired to be currently encoded. In this instance, the proximately located symbol may correspond to a symbol corresponding to a previous frequency domain of a previous frame or a current frame based on the current frame corresponding to the symbol of the MSB desired to be currently encoded.

For example, the initial scaling information may be estimated based on a size of the proximately located symbol determined through the context mode, for example, by the encoding apparatus 300. In particular, the encoding apparatus 300 may determine a spectrum coefficient to estimate the initial scaling information based on the context mode, and may estimate the initial scaling information based on the determined spectrum coefficient.

In operation 1002, it may determined whether the quantized frequency spectrum coefficient scaled based on the initial scaling information deviates from a predetermined range for the symbol of the MSB to encode the escape code, for example, by the encoding apparatus 300. The frequency spectrum coefficient may be scaled the same number of times as the number of times in which encoding of the escape code is performed.

In operation 1003, the scaled symbol of the MSB may be encoded, for example, by the encoding apparatus 300 of FIG. 3. In operation 1004, an LSB corresponding to a residual bit generated in a scaling process may be encoded, for example, by the encoding apparatus 300.

Figure 11:
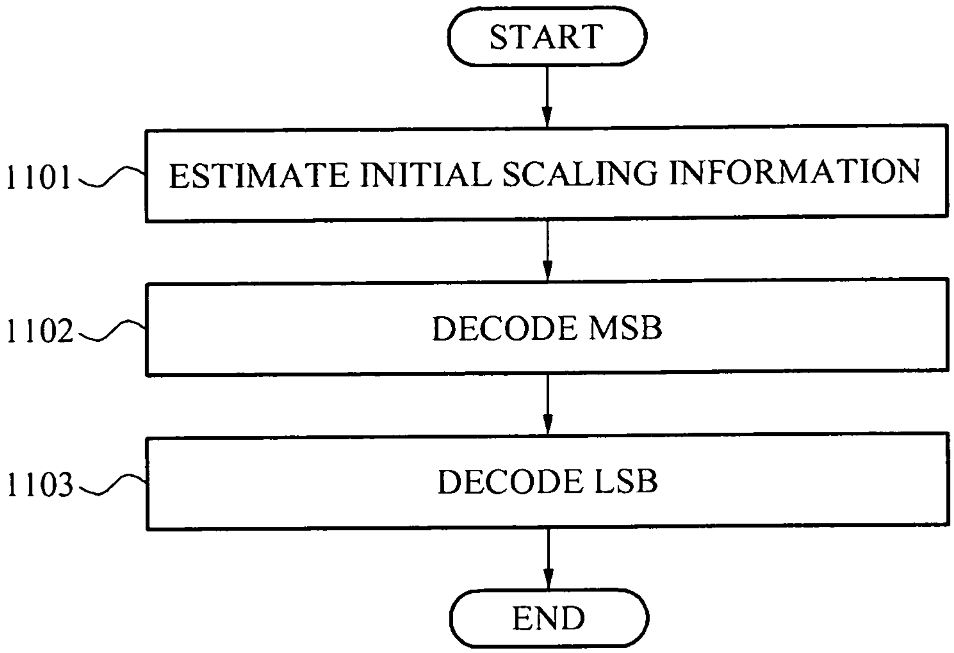
FIG. 11 is a flowchart illustrating another example of a configuration of a decoding method.

FIG. 11 includes another example of a decoding method.

In operation 1101, initial scaling information associated with a symbol of the MSB may be estimated, for example, by the decoding apparatus 400 of FIG. 4. The estimated initial scaling information may be used for scaling the symbol of the MSB. For example, the decoding apparatus 400 may estimate the initial scaling information based on a context mode corresponding to relative location information of a symbol located proximate to a symbol of the MSB based on the symbol of the MSB desired to be currently encoded.

In operation 1102, the symbol of the MSB may be decoded, for example, by the decoding apparatus 400 of FIG. 4. The decoded symbol of the MSB may be scaled the same number of times as the number of times the decoding of an escape code is performed.

In operation 1103, the decoding apparatus 400 may decode a symbol of the LSB may be decoded, for example, by the decoding apparatus 400. The symbol of the LSB may be added to the scaled symbol of the MSB to restore the finally decoded frequency spectrum coefficient.

The processes, functions, methods and/or software described above including a method of encoding and decoding a quantized frequency spectrum coefficient may be recorded, stored, or fixed in one or more non-transitory computer-readable storage media or processor-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. The methods described herein including the method of encoding and decoding a quantized frequency spectrum coefficient may be executed on a general purpose computer or processor or may be executed on a particular machine such as the encoding apparatus and decoding apparatus described herein.

Examples of computer-readable media or processor-readable media include: magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as code produced by a compiler, and files containing higher level code that may be executed by the computer or processor using an interpreter.

The described hardware units may also be configured to act as one or more software modules in order to perform the operations of the above-described embodiments. Any one or more of the software modules described herein may be executed by a dedicated processor unique to that unit or by a processor common to one or more of the modules.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An encoding apparatus to configure a plurality of quantized frequency spectrum coefficients as at least one tuple, and to separate the at least one tuple into a plurality of most significant bits (MSBs) and a plurality of least significant bits (LSBs) to encode the MSBs of the at least one tuple and the LSBs of the at least one tuple, the encoding apparatus comprising:

a processor to control one or more processor-executable units;

a rearrangement unit to rearrange symbols of the MSBs of the at least one tuple; and a sequence information encoding unit to encode sequence information between the symbols of the MSBs of the at least one tuple.

2. The encoding apparatus of claim 1, wherein the rearrangement unit rearranges the symbols of the MSBs of the at least one tuple in an ascending order of value.

3. The encoding apparatus of claim 1, wherein the sequence information encoding unit encodes the sequence information between the symbols of the MSBs of the at least one tuple when values of the symbols are different from each other.

4. A decoding apparatus to configure a plurality of quantized frequency spectrum coefficients as at least one tuple, and to separate the at least one tuple into a plurality of most significant bits (MSB) and a plurality of least significant bits (LSBs) to decode the MSBs of the at least one tuple and the LSBs of the at least one tuple, the decoding apparatus comprising:

a processor to control one or more processor-executable units;

an MSB decoder to decode symbols of encoded MSBs of the at least one tuple;

a sequence information decoder to decode sequence information between the symbols based on the symbols of the decoded MSBs of the at least one tuple; and an alignment unit to align the symbols of the MSBs of the at least one tuple based on the sequence information.

5. The decoding apparatus of claim 4, wherein the sequence information decoder decodes the sequence information between the symbols of the decoded MSBs of the at least one tuple when the symbols are different from each other.

6. An encoding apparatus to configure a plurality of quantized frequency spectrum coefficients as at least one tuple, and to separate the at least one tuple into a plurality of most significant bits (MSBs) and a plurality of least significant bits (LSBs) to encode the MSBs of the at least one tuple and the LSBs of the at least one tuple, the encoding apparatus comprising:

a processor to control one or more processor-executable units; and a scaling information estimating unit to estimate initial scaling information associated with symbols of the MSBs of the at least one tuple.

7. The encoding apparatus of claim 6, wherein the scaling information estimating unit estimates the initial scaling information based on a context mode corresponding to relative location information of a symbol located proximate to a symbol of the MSB based on the symbol of the MSB desired to be currently encoded.

8. The encoding apparatus of claim 7, wherein the scaling information estimating unit estimates the initial scaling information based on a size of the proximately located symbol determined through the context mode.

9. A decoding apparatus to configure a plurality of quantized frequency spectrum coefficients as at least one tuple, and to separate the at least one tuple into a plurality of most significant bits (MSBs) and a plurality of least significant bits (LSBs) to decode the MSBs of the at least one tuple and the LSBs of the at least one tuple, the decoding apparatus comprising:

a processor to control one or more processor-executable units; and a scaling information estimating unit to estimate initial scaling information associated with symbols of the MSBs of the at least one tuple.

10. The decoding apparatus of claim 9, wherein the scaling information estimating unit estimates the initial scaling information based on a context mode corresponding to relative location information of a symbol located proximate to a symbol of the MSB based on the symbol of the MSB desired to be currently decoded.

11. The decoding apparatus of claim 10, wherein the scaling information estimating unit estimates the initial scaling information based on a size of the proximately located symbol determined through the context mode.

12. An encoding method configuring a plurality of quantized frequency spectrum coefficients as at least one tuple, and separating the at least one tuple into a plurality of most significant bits (MSBs) and a plurality of least significant bits (LSBs) to encode the MSBs of the at least one tuple and the LSBs of the at least one tuple, the encoding method comprising:

rearranging symbols of the MSBs of the at least one tuple in an ascending order of value; and encoding, by way of a processor, sequence information between the symbols of the MSBs of the at least one tuple when values of the symbols are different from each other.

13. A decoding method of configuring a plurality of quantized frequency spectrum coefficient as at least one tuple, and separating the at least one tuple into a plurality of most significant bits (MSBs) and a plurality of least significant bits (LSBs) to decode the MSBs of the at least one tuple and the LSBs of the at least one tuple, the decoding method comprising:

decoding symbols of encoded MSBs of the at least one tuple;

decoding, by way of a processor, sequence information between the symbols based on the symbols of the decoded MSBs of the at least one tuple; and aligning the symbols of the MSBs of the at least one tuple based on the decoded sequence information.

14. The decoding method of claim 13, wherein the decoding of the sequence information between the symbols comprises decoding the sequence information between the symbols of the decoded MSBs of the at least one tuple when the symbols are different from each other.

15. An encoding method of configuring a plurality of quantized frequency spectrum coefficient as at least one tuple, and separating the at least one tuple into a plurality of most significant bits (MSBs) and a plurality of least significant bits (LSBs) to encode the MSBs of the at least one tuple and the LSBs of the at least one tuple, the encoding method comprising:

estimating, by way of a processor, initial scaling information associated with symbols of the MSBs of the at least one tuple.

16. The encoding method of claim 15, wherein the estimating comprises estimating the initial scaling information based on a context mode corresponding to relative location information of a symbol located proximate to a symbol of the MSB based on the symbol of the MSB desired to be currently encoded.

17. The encoding method of claim 16, wherein the estimating comprises estimating the initial scaling information based on a size of the proximately located symbol determined through the context mode.

18. A decoding method of configuring a quantized frequency spectrum coefficients as at least one tuple, and separating the at least one tuple into a plurality of most significant bits (MSBs) and a plurality of least significant bits (LSBs) to decode the MSBs of the at least one tuple and the LSBs of the at least one tuple, the decoding method comprising:

estimating, by way of a processor, initial scaling information associated with symbols of the MSBs of the at least one tuple.

19. The decoding method of claim 18, wherein the estimating comprises estimating the initial scaling information based on a context mode corresponding to relative location information of a symbol located proximate to a symbol of the MSB based on the symbol of the MSB desired to be currently decoded.

20. The decoding method of claim 19, wherein the estimating comprises estimating the initial scaling information based on a size of the proximately located symbol determined through the context mode.

21. An encoding method of configuring a plurality of quantized frequency spectrum coefficients as at least one tuple, the at least one tuple being a combination of quantized frequency spectrum coefficients having different frequencies, and separating the at least one tuple into a plurality of most significant bits (MSBs) and a plurality of least significant bits (LSBs) to encode the MSBs and the LSBs, the encoding method comprising:

rearranging symbols of the MSBs of the at least one tuple in an ascending order of value; and encoding, by way of a processor, sequence information of the symbols of the MSBs of the at least one tuple when values of the symbols are different from each other.

* * * * *

UNITED STATES PATENT AND TRADEMARK OFFICE

CERTIFICATE OF CORRECTION

PATENT NO. : 8,487,789 B2
APPLICATION NO. : 13/137025
DATED : July 16, 2013
INVENTOR(S) : Ki Hyun Choo et al.

It is certified that error appears in the above-identified patent and that said Letters Patent is hereby corrected as shown below:

In the Claims

In Column 11, Line 16, In Claim 4, delete “(MSB)” and insert -- (MSBs) --, therefor.

Signed and Sealed this
Eighteenth Day of February, 2014

Michelle K. Lee
*Deputy Director of the United States Patent and Trademark Office*